United States Patent

Kawakatsu et al.

[11] Patent Number: 5,568,002
[45] Date of Patent: Oct. 22, 1996

[54] IIDT TYPE SURFACE ACOUSTIC WAVE DEVICE

[75] Inventors: Takaharu Kawakatsu; Yutaka Tada; Hideharu Ieki, all of Nagaokakyo, Japan

[73] Assignee: Murata Manufacturing Co., Ltd., Japan

[21] Appl. No.: 541,935

[22] Filed: Oct. 10, 1995

Related U.S. Application Data

[63] Continuation of Ser. No. 174,053, Dec. 28, 1993, abandoned.

[30] Foreign Application Priority Data

Jan. 5, 1993 [JP] Japan .................... 5-000350

[51] Int. Cl.⁶ .................................. H01L 41/08
[52] U.S. Cl. .................. 310/313 B; 310/313 D
[58] Field of Search .................. 310/313 R, 313 B, 310/313 D, 193–196, 150–155

[56] References Cited

U.S. PATENT DOCUMENTS

| | | | |
|---|---|---|---|
| 3,872,410 | 3/1975 | Zucker | 333/72 |
| 4,044,321 | 8/1977 | Vasile | 333/72 |
| 4,468,642 | 8/1984 | Hikita | 310/313 D X |
| 4,649,357 | 3/1987 | Nagai et al. | 333/196 |
| 5,010,269 | 4/1991 | Hikita et al. | 310/313 B |
| 5,194,830 | 3/1993 | Fleischmann | 333/195 |
| 5,300,902 | 4/1994 | Satoh et al. | 310/313 R X |

FOREIGN PATENT DOCUMENTS 3942148  12/1989  Germany .

Primary Examiner—Mark O. Budd
Attorney, Agent, or Firm—Ostrolenk, Faber, Gerb & Soffen, LLP

[57] ABSTRACT

An IIDT type surface acoustic wave filter (41) comprising a piezoelectric substrate and at least three IDTs (44 to 46) which are arranged on a surface of the piezoelectric substrate along the direction of surface wave propagation, the IDT (44) being inverted in phase with respect to the other IDT (46) while these IDTs (44) and (46) are connected in series to each other through the ground potential, thereby balancing inputs or outputs.

12 Claims, 7 Drawing Sheets

IIDT TYPE SURFACE ACOUSTIC WAVE DEVICE

This is a continuation of application Ser. No. 08/174,053 filed on Dec. 28, 1993 now abandoned.

BACKGROUND OF THE INVENTION

1. Field of the Invention

The present invention relates to an IIDT (Interdigited Interdigital Transducer) type surface acoustic wave device, and more particularly, it relates to an IIDT type surface acoustic wave device, in which at least either inputs or outputs are balanced with respect to the ground potential.

2. Description of the Background Art

In general, an IIDT type surface acoustic wave filter is known as a high-frequency surface acoustic wave filter which has a broad bandwidth and low insertion loss.

Figure 8:
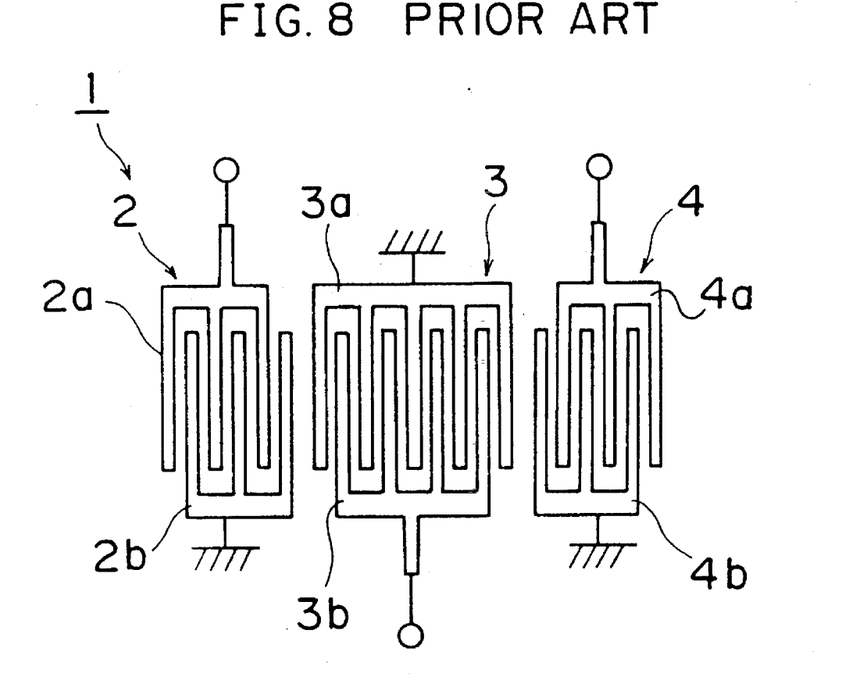
FIG. 8 is a typical plan view showing an exemplary electrode structure of a conventional IIDT type surface acoustic wave filter.

FIG. 8 shows an exemplary electrode structure of a conventional IIDT type surface acoustic wave filter 1. This surface acoustic wave filter 1 comprises a piezoelectric substrate (not shown) and three interdigital transducers (hereinafter referred to as IDTs) 2 to 4 which are arranged thereon along the direction of surface wave propagation. The IDTs 2 to 4 are respectively provided with pairs of comb electrodes 2a and 2b, 3a and 3b, and 4a and 4b which are so arranged that electrode fingers thereof interdigitate with each other. These IDTs 2 to 4 alternately serve as input (or output) IDT and output (or input) IDT, respectively, along the direction of surface wave propagation.

Figure 9:
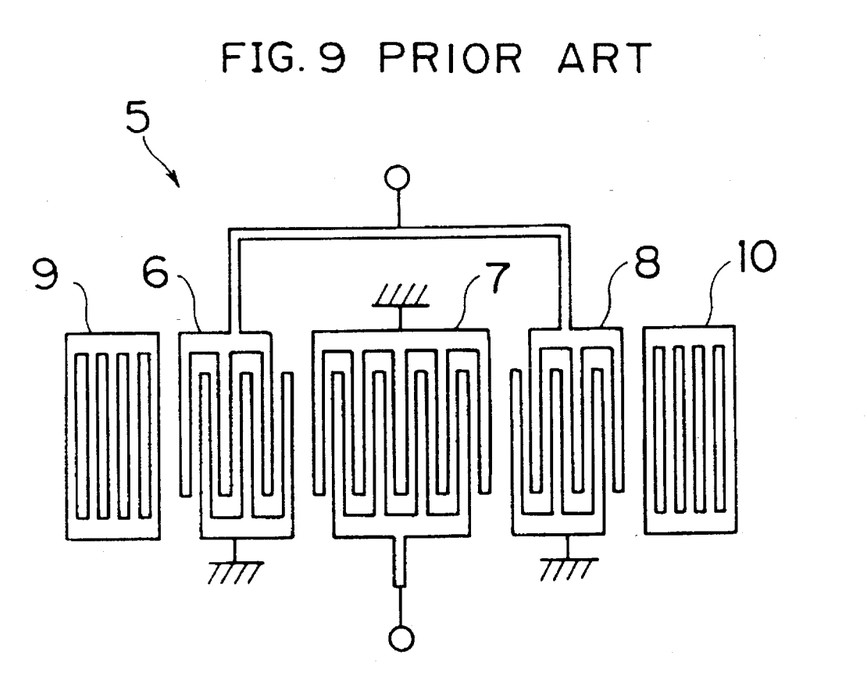
FIG. 9 is a typical plan view showing another exemplary electrode structure of a conventional IIDT type surface acoustic wave filter.

FIG. 9 illustrates another exemplary electrode structure of a conventional IIDT type surface acoustic wave filter 5. This surface acoustic wave filter 5 comprises three IDTs 6 to 8 which are arranged along the direction of surface wave propagation, to alternatively serve as input (or output) IDT or output (or input) IDT. Further, reflectors 9 and 10 are arranged on both sides of the IDTs 6 to 8 along the direction of surface wave propagation. This IIDT type surface acoustic wave filter 5 is a three-electrode in-line coupled double-mode surface acoustic wave resonator filter.

In recent years, it is necessary to balance at least either inputs or outputs in a surface acoustic wave filter so that the same can be connected to a differential input/output IC (integrated circuit) with no employment of a balun, i.e., a balanced-to-unbalanced transformer, following integration of circuits around the surface acoustic wave filter.

Figure 10:
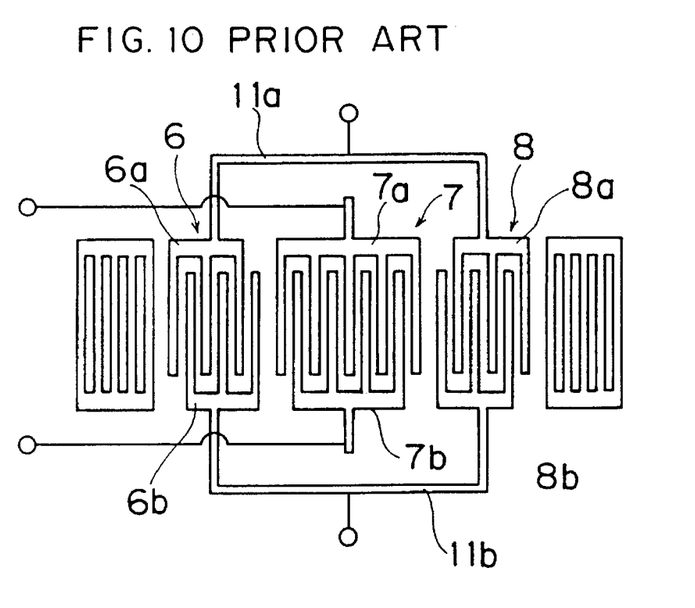
FIG. 10 is a typical plan view showing an exemplary method of balancing inputs and outputs in the conventional filter shown in FIG. 9.

Referring to the three-electrode in-line coupled double-mode surface acoustic wave filter 5 shown in FIG. 9, for example, it is possible to balance inputs and outputs by forming input ends (or output ends) across the comb electrodes 7a and 7b of the IDT 7 while connecting the comb electrodes 6a and 8a as well as the comb electrodes 6b and 8b provided on the same sides of the IDTs 6 and 8 to connection conductive parts 11a and 11b which are formed on a piezoelectric substrate in common respectively to define output ends (or input ends), as shown in FIG. 10. According to this method, however, bonding wires are so increased in length that the filter 5 is reduced in reliability, while its high-frequency characteristics are deteriorated by inductances of the bonding wires.

Figure 11:
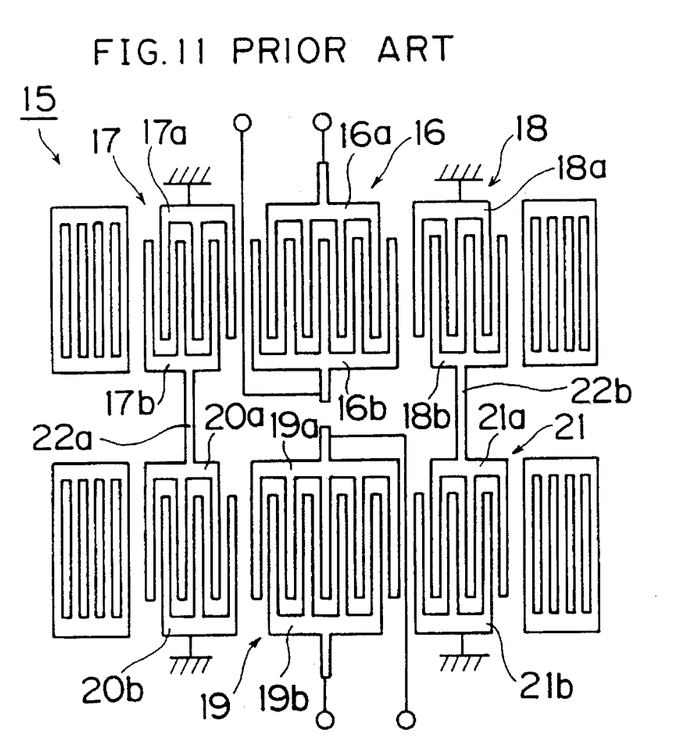
FIG. 11 is a typical plan view for illustrating still another conventional IIDT type surface acoustic wave filter.

On the other hand, it is also possible to balance inputs and outputs in a two-stage connection type surface acoustic wave filter 15 which is formed by connecting two IIDT type surface acoustic wave filters with each other, as shown in FIG. 11. In this surface acoustic wave filter 15, input ends (or output ends) are formed across comb electrodes 16a and 16b of an IDT 16 provided in an input stage (or output stage) IIDT type surface acoustic wave filter. First comb electrodes 17a and 18a of IDTs 17 and 18 which are arranged on both sides of the IDT 16 are connected to the ground potential while second comb electrodes 17b and 18b thereof are connected to first comb electrodes 20a and 21a of IDTs 20 and 21 provided in an output stage (or input stage) surface acoustic wave filter by connection to conductive parts 22a and 22b respectively. Second comb electrodes 20b and 21b of the output stage (or input stage) IDTs 20 and 21 are connected to the ground potential. Output ends (or input ends) are formed across comb electrodes 19a and 19b of an IDT 19.

In the two-stage connection type surface acoustic wave filter 15, however, a bus bar of the comb electrode 16b of the IDT 16 is in proximity to that of the comb electrode 19a of the IDT 19 provided in the output stage (or input stage) IIDT type surface acoustic wave filter. Even if the inputs and outputs are balanced in the aforementioned manner, therefore, sufficient balancing cannot be attained, also with difference in length of bonding wires.

Figure 12:
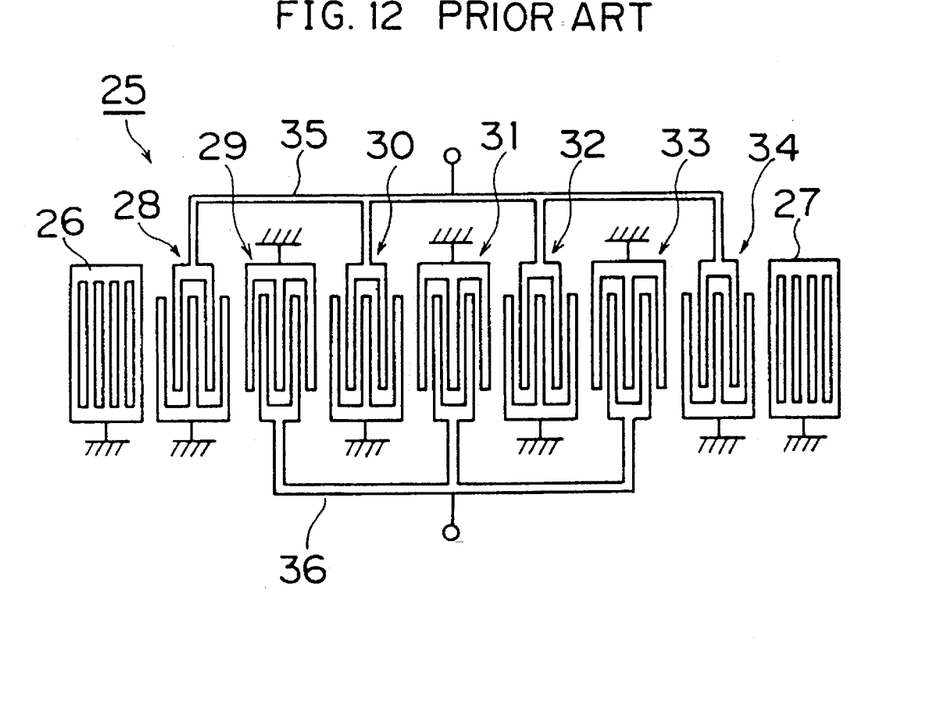
FIG. 12 is a typical plan view showing a further conventional IIDT type surface acoustic wave filter.

The aforementioned problem is more serious in an IIDT type surface acoustic wave filter 25 shown in FIG. 12, which is provided with a larger number of IDTs. In the IIDT type surface acoustic wave filter 25, seven IDTs 28 to 34 are arranged between reflectors 26 and 27, so that the IDTs 28, 30, 32 and 34 are electrically connected with each other by a connection conductive part 35 and the IDTs 29, 31 and 33 are also electrically connected with each other by another connection conductive part 36. When such IIDT type surface acoustic wave filters 25 are connected with each other in a plurality of stages, therefore, bonding wires are further increased in length such that the as-formed surface acoustic wave device is deteriorated in reliability or the same cannot be formed as a practical device due to deterioration of balancing.

It is known that spaces between IDTs are effectively filled up with electrodes for reducing insertion loss particularly when a 64° Y–X LiNbO$_3$ substrate is employed as a piezoelectric substrate. When inputs and outputs are balanced by the aforementioned conventional method, however, it is impossible to fill up the spaces between IDTs with electrodes.

SUMMARY OF THE INVENTION

An object of the present invention is to provide a novel IIDT type surface acoustic wave device which can balance inputs and/or outputs with no trouble in structure, thereby solving the aforementioned various problems of the prior art.

According to a wide aspect of the present invention, an IIDT type surface acoustic wave device comprises a piezoelectric substrate and at least three IDTs which are formed on a surface of the piezoelectric substrate along the direction of surface wave propagation and each provided with a pair of comb electrodes having plural electrode fingers interdigitating with each other, so that the IDTs alternately serve as input (or output) IDT or output (or input) IDT. When the input or output IDTs provided in an even number are divided into two groups along the center of a region provided with all IDTs, each IDT belonging to the first group is inverted in phase with respect to that belonging to the second group while the two groups of IDTs are connected in series to each other.

According to the IIDT type surface acoustic wave device, each IDT belonging to the first group is inverted in phase with respect to that belonging to the second group when the even number of IDTs are divided into two groups along the center, while the two groups of IDTs are connected in series to each other. Therefore, inputs or outputs are balanced on the side provided with the even number of IDTs. In this case, further, lengths of bonding wires are not much increased, as clearly understood from electrode patterns in embodiments described later. Thus, it is possible to provide an IIDT type surface acoustic wave device which is excellent in reliability with sufficient balancing.

According to a specific aspect of the present invention, an IIDT type multi-stage surface acoustic wave device comprises a piezoelectric substrate and at least two stages of IIDT type surface acoustic wave devices which are formed on the piezoelectric substrate to be successively connected with each other. At least either the input or output stage IIDT type surface acoustic wave device is formed by the IIDT type surface acoustic wave device recited above, while those of the IDTs provided in an even number serve as input or output IDTs.

In such a multi-stage IIDT type surface acoustic wave device, at least either the input or output stage IIDT type surface acoustic wave device is formed recited above while those of the IDTs provided in an even number serve as input or output IDTs, whereby it is possible to balance at least either inputs or outputs in the multi-stage IIDT type surface acoustic wave device. Further, lengths of bonding wires are not much increased in the IDTs having the as-balanced inputs or outputs. Particularly in a multi-stage connection type surface acoustic wave filter of the prior art, it has been extremely difficult to balance inputs and/or outputs in practice. According to the present invention, on the other hand, it is possible to sufficiently balance inputs and/or outputs in such a multi-stage connection type surface acoustic wave filter, since lengths of bonding wires may not be much increased.

According to the present invention, further, electrode fingers which are located on end portions can be connected to the ground potential in designing of the IDTs, whereby it is possible to reduce insertion loss by filling up spaces between the IDTs with electrodes.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described.

First Embodiment

Figure 1A:
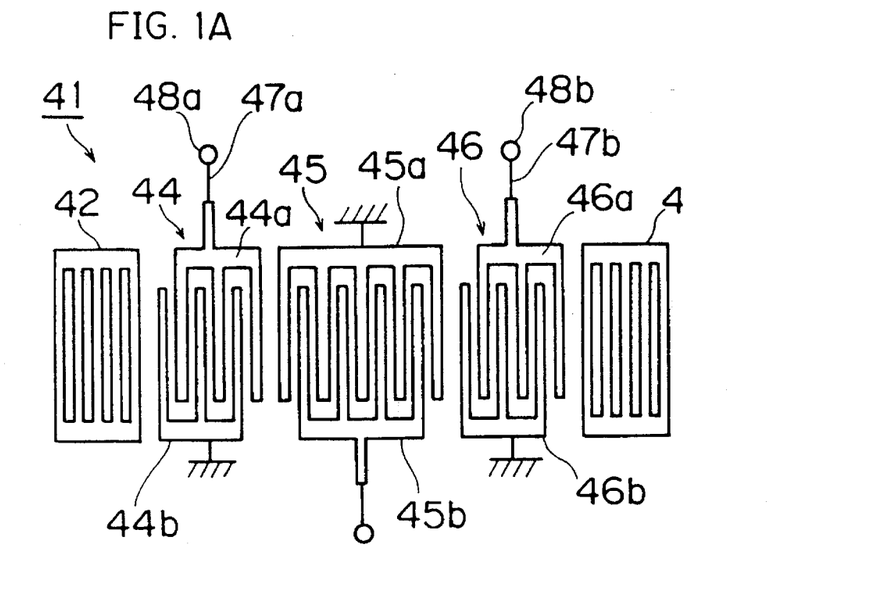
FIG. 1A is a typical plan view showing an electrode structure of an IIDT type surface acoustic wave filter according to a first embodiment of the present invention.
Figure 1B:
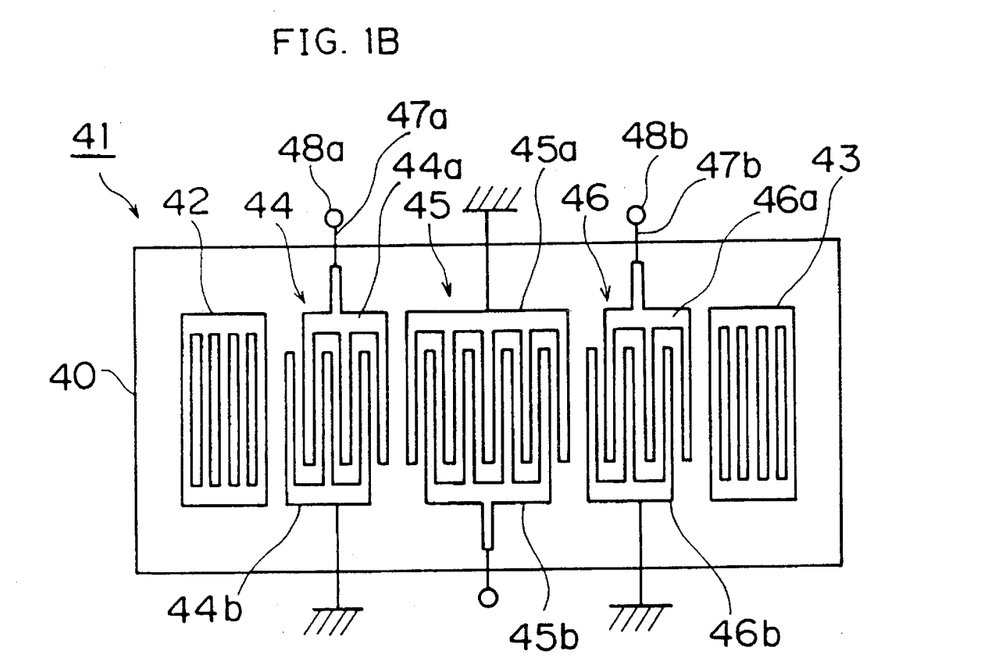
FIG. 1B is a plan view showing the IIDT type surface acoustic wave filter according to the first embodiment of the present invention.

FIG. 1A illustrates an electrode structure of a three-electrode in-line coupled double-mode surface acoustic wave filter 41 according to a first embodiment of the present invention, and FIG. 1B is a plan view of the IIDT type surface acoustic wave filter 41 according to the first embodiment. The surface acoustic wave filter 41 comprises a piezoelectric substrate 40 and three IDTs 44, 45 and 46 which are arranged on the substrate 40 along the direction of surface wave propagation between reflectors 42 and 43. The IDT 45 forms an input or output IDT. On the other hand, the remaining IDTs 44 and 46 are employed as output (or input) IDTs.

The IDTs 44 and 46 are so formed that the IDT 44 is inverted in phase with respect to the other IDT 46. A comb electrode 44a of the IDT 44 is drawn out by a bonding wire 47a, while a comb electrode 46a of the IDT 46 provided on the same side as the electrode 44a is also drawn out by another bonding wire 47b. On the other hand, comb electrodes 44b and 46b are connected to the ground potential.

It is clearly understood from FIG. 1A that the distance between the comb electrodes 45a and 46a is displaced by one electrode finger pitch as compared with that between the comb electrodes 44a and 45a. Since the electrode fingers of the comb electrode 44a of the IDT 44 are thus displaced with respect to those of the comb electrode 46a of the IDT 46, the IDTs 44 and 46 are inverted in phase to each other. Further, the IDTs 44 and 46 are connected in series to each other through the ground potential. Therefore, balanced inputs or outputs are drawn out across terminals 48a and 48b which are connected to the bonding wires 47a and 47b.

Further, the bonding wires 47a and 47b which are arranged on the same side can be considerably reduced in length as compared with those of the conventional surface acoustic wave filter (see FIG. 10) having balanced inputs or outputs. While the remaining comb electrodes 44b and 46b of the IDTs 44 and 46 are connected to the ground potential in the surface acoustic wave filter 41 according to this embodiment, a package for a high-frequency device is generally provided with a large ground area and hence the same can be connected with the comb electrodes 44b and 46b through short bonding wires.

In the surface acoustic wave filter 41 according to this embodiment, therefore, the bonding wires which are necessary for connection of the IDTs are not much increased in length, whereby sufficient reliability can be ensured.

The comb electrodes 44b and 46b of the IDTs 44 and 46 may be electrically connected with each other through a conductive pattern when the surface acoustic wave filter chip has sufficient allowance, while this conductive pattern is preferably further connected with the ground potential also in this case.

Second Embodiment

Figure 2:
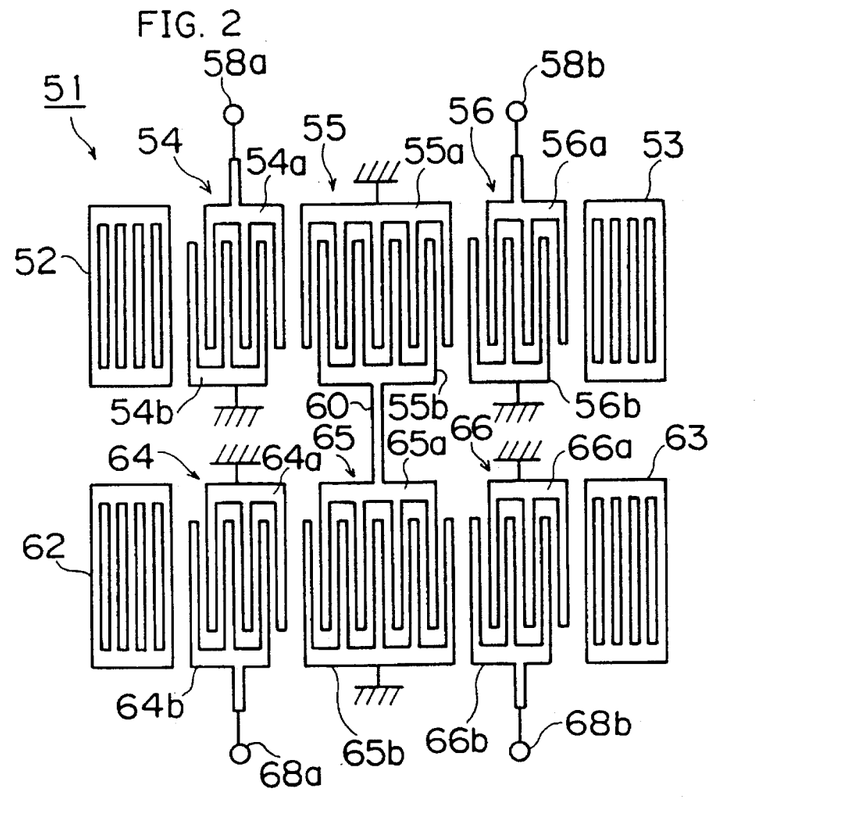
FIG. 2 is a typical plan view showing an electrode structure of an IIDT type surface acoustic wave filter according to a second embodiment of the present invention.

FIG. 2 illustrates an electrode structure of an IIDT type surface acoustic wave filter 51 according to a second embodiment of the present invention. This IIDT type surface acoustic wave filter 51 is a two-stage connection type surface acoustic wave filter. Each stage of surface acoustic wave filter has an electrode structure which is substantially similar to that of the IIDT type surface acoustic wave filter 41 shown in FIG. 1A.

Namely, three IDTs 54 to 56 are arranged between reflectors 52 and 53 in the input stage surface acoustic wave filter, while three IDTs 64 to 66 are similarly arranged between reflectors 62 and 63 in the output stage surface acoustic wave filter. Comb electrodes 55b and 65a of the IDTs 55 and 65 are electrically connected with each other by a conductive pattern 60.

Also in the IIDT type surface acoustic wave filter 51 according to this embodiment, the IDT 56 is inverted in phase with respect to the IDT 54 in the input stage, while the IDT 66 is also inverted in phase with respect to the IDT 64 in the output stage. Thus, inputs which are applied across terminals 58a and 58b and outputs which are drawn out across terminals 68a and 68b are balanced.

Further, the terminals 58a and 58b as well as the terminals 68a and 68b are formed on the same sides respectively, whereby it is possible to balance the inputs and the outputs without much increasing lengths of bonding wires, similarly to the first embodiment.

In addition, the bonding wires which are necessary for connecting the comb electrodes 54b, 55a, 56b, 64a, 65b and 66a with the ground potential can also be reduced in length also similarly to the first embodiment, since a high-frequency device is generally provided with a large ground area.

When three or more stages of IIDT type surface acoustic wave filters are connected with each other, no balancing is necessary for those forming no input and output stages but only those provided on both ends, i.e., input and output stage filters, may be balanced. While the inputs and outputs are balanced in both of the input and output stage filters in the second embodiment, such balancing may be carried out only one of the stages.

Embodiments for Illustrating Phase Inversion Methods

Figure 3:
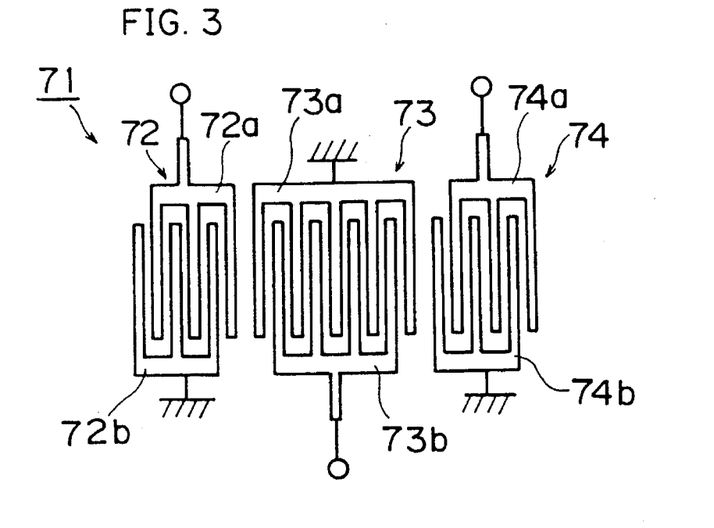
FIG. 3 is a typical plan view showing an electrode structure of an IIDT type surface acoustic wave filter according to a third embodiment of the present invention.
Figure 4:
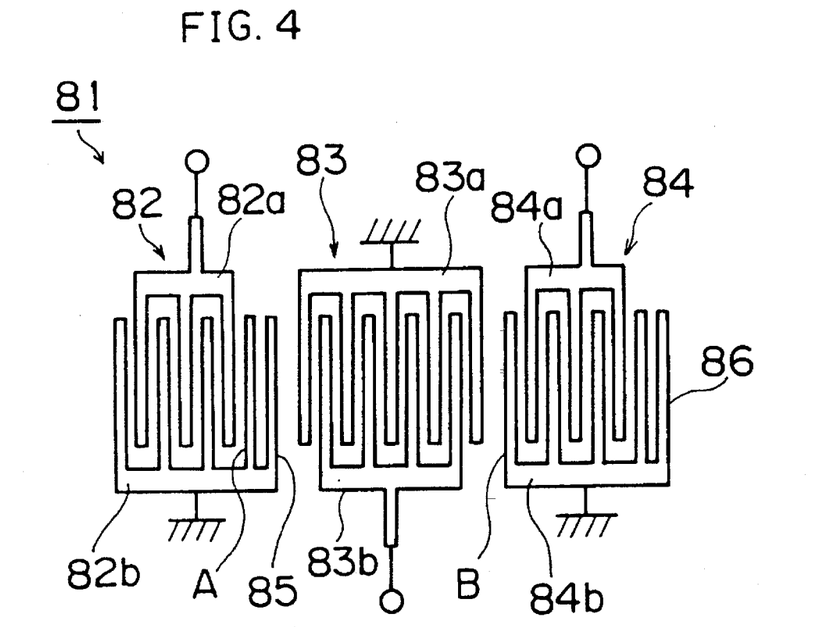
FIG. 4 is a typical plan view showing an electrode structure of an IIDT type surface acoustic wave filter according to a fourth embodiment of the present invention.

FIGS. 3 and 4 are electrode structural diagrams showing IIDT type surface acoustic wave filters 71 and 81 according to third and fourth embodiments of the present invention, employing phase inversion methods which are different from each other.

In the surface acoustic wave filter 71 shown in FIG. 3, three IDTs 72 to 74 are arranged along the direction of surface wave propagation. Input ends (or output ends) are formed across comb electrodes 72a and 74a of the IDTs 72 and 74 which are provided on both sides. Remaining comb electrodes 72b and 74b are connected to the ground potential. When the IDTs 72 and 74 are employed as input IDTs, therefore, it is possible to balance the inputs similarly to the first embodiment.

According to this embodiment, the distance between comb electrodes 73a and 74a is increased by one pitch as compared with that between a comb electrode 72a and the comb electrode 73a so that electrode fingers of the comb electrode 72a provided in the IDT 72 are displaced pitchwise with respect to those of the comb electrode 74a provided in the IDT 74 similarly to the first and second embodiments, whereby the IDT 74 is inverted in phase with respect to the IDT 72.

In the IIDT type surface acoustic wave filter 81 according to the fourth embodiment shown in FIG. 4, on the other hand, dummy electrode fingers 85 and 86 are provided on second comb electrodes 82b and 84b which are paired with first comb electrodes 82a and 84a of IDTs 82 and 84 respectively. The dummy electrode finger 85 is provided beyond an electrode finger A of the comb electrode 82b which is closest to an IDT 83, to be closer to the IDT 83 by one pitch. The distance between the dummy electrode finger 85 and the IDT 83 is equal to that between the IDT 83 and the comb electrode 84b.

Therefore, the distance between the electrode finger A of the comb electrode 82b provided in the IDT 82, which is closest to the IDT 83, and a comb electrode 83b of the IDT 83 is increased by one pitch as compared with that between an electrode finger B of the comb electrode 84b which is closest to the IDT 83. Thus, the IDT 82 is inverted in phase with respect to the IDT 84. The dummy electrode finger 86 which is provided on the comb electrode 84b of the IDT 84 may not be necessary in particular.

Figure 5:
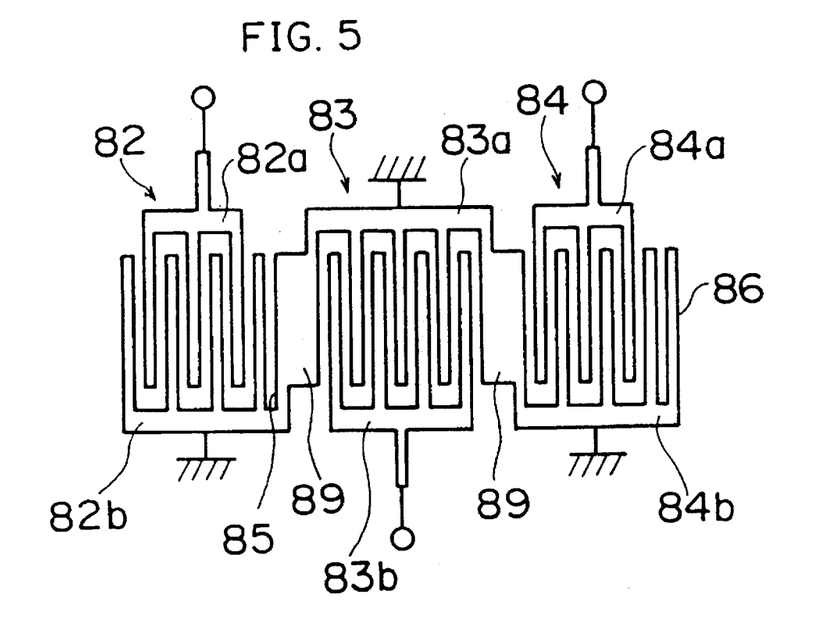
FIG. 5 is a typical plan view showing an electrode structure of an IIDT type surface acoustic wave filter according to a fifth embodiment of the present invention.

It is also possible to invert the outer IDTs 82 to 84 in phase to each other by forming the dummy electrode finger 85, as shown in the fourth embodiment. In this case, the electrode fingers which are connected to the ground potential can be arranged to enclose outer sides of the IDTs, whereby the spaces between the IDTs 82 and 84 can be filled up with electrodes 89 as shown in FIG. 5, in order to reduce insertion loss. Thus, it is possible to further reduce insertion loss.

The dummy electrode fingers 85 and 86 are adapted to prevent the phases of the IDTs 82 and 84 from slight displacement from complete inversion, by difference in propagation velocity of surface acoustic waves between portions provided with the electrode fingers and those provided with no electrode fingers. When such difference in velocity can be absorbed by finely adjusting the positions of the IDTs 82 and 84, it is possible to omit the dummy electrode fingers 85 and 86.

Embodiments of IIDT type Surface Acoustic Wave Filters Provided with More IDTs

Figure 6:
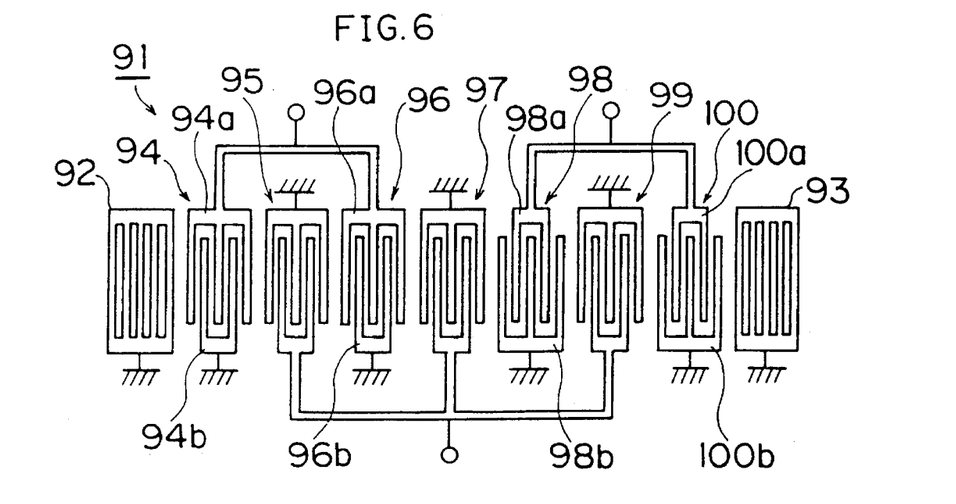
FIG. 6 is a typical plan view showing an electrode structure of an IIDT type surface acoustic wave filter according to a sixth embodiment of the present invention.
Figure 7:
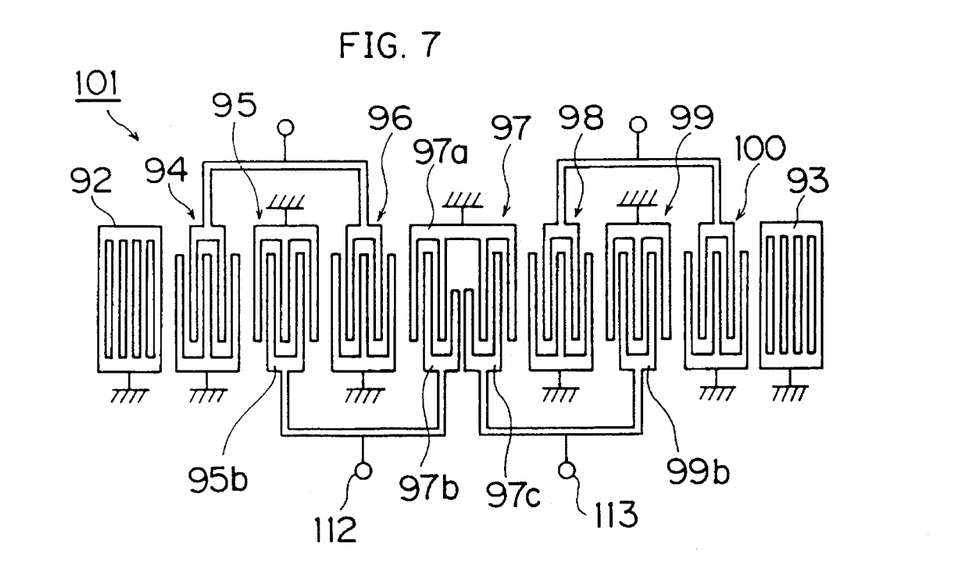
FIG. 7 is a typical plan view showing an electrode structure of an IIDT type surface acoustic wave filter according to a seventh embodiment of the present invention.

FIGS. 6 and 7 illustrate electrode structures of IIDT type surface acoustic wave filters 91 and 101 according to sixth and seventh embodiments of the present invention. In the sixth and seventh embodiments, the numbers of IDTs are increased as compared with those in the aforementioned embodiments.

In the IIDT type surface acoustic wave filter 91 shown in FIG. 6, seven IDTs 94 to 100 are arranged between reflectors 92 and 93 along the direction of surface wave propagation. These IDTs 94 to 100 are alternately employed as input (or output) and output (or input) IDTs along the direction of surface wave propagation respectively.

It is assumed here that the IDTs 94, 96, 98 and 100 are input IDTs, and the IDTs 95, 97 and 99 are output IDTs. In a group including an even number of IDTs, i.e., the input IDTs 94, 96, 98 and 100, the IDTs 94 and 96, which are located on the left side of the region provided with all IDTs along the direction of surface acoustic propagation, are inverted in phase with respect to the IDTs 98 and 100 which are provided on the right side.

The phases of the IDTs are inverted in the same method as that in the first embodiment. Namely, distances between comb electrodes 96a and 98a which are provided on the same side and the IDT 95 are so displaced that the IDT 96 is inverted in phase with respect to the IDT 98, similarly to the first embodiment. In the IDTs 94 and 96, comb electrodes 94a and 96a are connected in common while remaining comb electrodes 94b and 96b are connected to the ground potential. In the IDTs 98 and 100 which are located on the right side, comb electrodes 98a and 100a are connected in common while remaining comb electrodes 98b and 100b are connected to the ground potential, similarly to the above. Thus, the IDTs 94 and 96 as well as the IDTs 98 and 100 are connected in series to each other through the ground potential, so that the inputs are balanced with each other.

In the IIDT type surface acoustic wave filter 101 shown in FIG. 7, on the other hand, seven IDTs 94 to 100 are arranged between reflectors 92 and 93 along the direction of surface wave propagation, similarly to the sixth embodiment. Among these IDTs, the IDTs 94, 98, 98 and 100 which are employed as input IDTs, for example, are formed similarly to those in the embodiment shown in FIG. 6. The seventh embodiment is different from the sixth embodiment in a point that the IDT 97 which is located at the center of those employed as output IDTs, for example, is divided into two parts along the direction of surface wave propagation.

This IDT 97 is provided with a comb electrode 97a, and comb electrodes 97b and 97c whose electrode fingers interdigitate with those of the comb electrode 97a. The comb electrodes 97b and 97c are connected in common with comb electrodes 95b and 99b of the IDTs 95 and 99 respectively. The IDT 97 which is divided into two parts functions as two IDTs, whereby outputs which are drawn out across terminals 112 and 113 are balanced also on the output end.

As clearly understood from FIGS. 6 and 7, it is possible to balance at least either inputs or outputs without much increasing lengths of bonding wires according to the present invention, also when the number of IDTs is increased.

In general, IDTs tend to be reduced in impedance in a high frequency region to hinder excellent impedance matching. According to the present invention, however, a plurality of IDTs which are provided on a balanced side are connected in series to each other through the ground potential. Therefore, the IDTs which are connected in series to each other are increased in impedance, to facilitate impedance matching.

The IIDT type surface acoustic wave device according to the present invention is not restricted to the aforementioned IIDT type surface acoustic wave filter, but is also applicable to a delay line or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An IIDT type surface acoustic wave device comprising a piezoelectric substrate and at least three interdigital transducers formed on a surface of said piezoelectric substrate along a direction of surface wave propagation and each provided with a pair of comb electrodes having plural electrode fingers interdigitating with each other, said interdigital transducers each being one of two types, said two types comprising an input and an output interdigital transducer along the direction of surface wave propagation, said transducers of the same type comprising an even number and being divided into first and second groups wherein a group may comprise a single transducer, each interdigital transducer in a first group being inverted in phase with respect to each interdigital transducer in a second group, said two groups being formed along a center of a region provided with all said interdigital transducers, said two groups of said transducers being connected in series to each other.

2. An IIDT type surface acoustic wave device in accordance with claim 1, wherein a one of said comb electrodes connected to an end of each said interdigital transducer in said first group is displaced by one electrode finger pitch with respect to a one of said comb electrodes connected to an end of each said interdigital transducer in said second group, each said interdigital transducer in said first group being thereby inverted in phase with respect to each said interdigital transducer in said second group.

3. An IIDT type surface acoustic wave device in accordance with claim 1, wherein a one of said comb electrodes combined with a one of said comb electrodes connected to an end of each said interdigital transducer in said first group is provided with a dummy electrode finger or dummy fingers of an odd number, each said interdigital transducer in said first group being thereby inverted in phase with respect to each said interdigital transducer belong to said second group.

4. An IIDT type surface acoustic wave device in accordance with claim 1, wherein each said interdigital transducer into said first group is connected in series to each said interdigital transducer into said group through ground potential.

5. An IIDT type surface acoustic wave device in accordance with claim 1, wherein balanced ends are arranged on one side of said region provided with all said interdigital transducers.

6. An IIDT type surface acoustic wave device in accordance with claim 1, further comprising a pair of reflectors provided on both sides of a region provided with said at least three interdigital transducers.

7. An IIDT type multi-stage surface acoustic wave device comprising a piezoelectric substrate and at least two stages of IIDT type surface acoustic wave devices formed on said piezoelectric substrate and successively connected with each other, each said IIDT type surface acoustic wave device comprising at least one of an input stage and an output stage, each said IIDT type surface acoustic wave device comprising a piezoelectric substrate and at least three interdigital transducers formed on a surface of said piezoelectric substrate along a direction of surface wave propagation and each provided with a pair of comb electrodes having plural electrode fingers interdigitating with each other, said interdigital transducers each being one of two types, said two types comprising an input and an output interdigital transducer along the direction of surface wave propagation, said transducers of the same type comprising an even number and being divided into first and second groups wherein a group may comprise a single transducer, each interdigital transducer in a first group being inverted in phase with respect to each interdigital transducer in a second group, said two groups being formed along a center of a region provided with all said interdigital transducers, said two groups of said transducers being connected in series to each other.

8. An IIDT type multi-stage surface acoustic wave device in accordance with claim 7, wherein a one of said comb electrodes connected to an end of each said interdigital transducer in said first group is displaced by one electrode finger pitch with respect to a one of said comb electrodes connected to an end of each said interdigital transducer in said second group, each said interdigital transducer in said first group being thereby inverted in phase with respect to each said interdigital transducer in said second group.

9. An IIDT type multi-stage surface acoustic wave device in accordance with claim 7, wherein a one of said comb electrodes combined with a one of said comb electrodes connected to an end of each said interdigital transducer in said first group is provided with a dummy electrode finger or dummy fingers of an odd number, each said interdigital transducer in said first group being thereby inverted in phase with respect to each said interdigital transducer in said second group.

10. An IIDT type multi-stage surface acoustic wave device in accordance with claim 7, wherein each said interdigital transducer into said first group is connected in series to each said interdigital transducer into said second group through ground potential.

11. An IIDT type multi-stage surface acoustic wave device in accordance with claim 7, wherein balanced ends are arranged on one side of said region provided with all said interdigital transducers.

12. An IIDT type multi-stage surface acoustic wave device in accordance with claim 7, further comprising a pair of reflectors provided on both sides of a region provided with said at least three interdigital transducers.

* * * * *